United States Patent
Miyazaki et al.

(10) Patent No.: US 9,842,918 B2
(45) Date of Patent: Dec. 12, 2017

(54) SEMICONDUCTOR DEVICE AND METHOD FOR PRODUCING THE SAME

(71) Applicant: FUJI ELECTRIC CO., LTD., Kawasaki-Shi (JP)

(72) Inventors: Masayuki Miyazaki, Matsumoto (JP); Takashi Yoshimura, Matsumoto (JP); Hiroshi Takishita, Matsumoto (JP); Hidenao Kuribayashi, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/288,132

(22) Filed: Oct. 7, 2016

(65) Prior Publication Data

US 2017/0025520 A1 Jan. 26, 2017

Related U.S. Application Data

(60) Division of application No. 14/301,914, filed on Jun. 11, 2014, now Pat. No. 9,520,475, which is a (Continued)

(30) Foreign Application Priority Data

Jan. 19, 2012 (JP) .................. 2012-009337

(51) Int. Cl.
*H01L 29/739* (2006.01)
*H01L 29/49* (2006.01)
(Continued)

(52) U.S. Cl.
CPC ........ *H01L 29/7395* (2013.01); *H01L 21/268* (2013.01); *H01L 21/26506* (2013.01);
(Continued)

(58) Field of Classification Search
CPC . H01L 29/0646; H01L 29/36; H01L 29/7395; H01L 21/268; H01L 21/26506; H01L 21/26513; H01L 21/324
See application file for complete search history.

(56) References Cited

U.S. PATENT DOCUMENTS 4,831,276 A 5/1989 Hyakumura
8,766,413 B2 7/2014 Nemoto et al.
(Continued)

FOREIGN PATENT DOCUMENTS

DE 102006046844 A1 4/2008
EP 1030375 A1 8/2000
(Continued)

OTHER PUBLICATIONS

International Search Report issued in International Application No. PCT/JP2013/051010 dated Mar. 19, 2013.
(Continued)

*Primary Examiner* — Christine Enad
(74) *Attorney, Agent, or Firm* — Rossi, Kimms & McDowell LLP

(57) ABSTRACT

A method of producing a semiconductor device is disclosed in which, after proton implantation is performed, a hydrogen-induced donor is formed by a furnace annealing process to form an n-type field stop layer. A disorder generated in a proton passage region is reduced by a laser annealing process to form an n-type disorder reduction region. As such, the n-type field stop layer and the n-type disorder reduction region are formed by the proton implantation. Therefore, it is possible to provide a stable and inexpensive semiconductor device which has low conduction resistance and can improve electrical characteristics, such as a leakage current, and a method for producing the semiconductor device.

17 Claims, 12 Drawing Sheets

Related U.S. Application Data continuation of application No. PCT/JP2013/051010, filed on Jan. 18, 2013.

(51) Int. Cl.

| | | |
|---|---|---|
| H01L 29/36 | (2006.01) | |
| H01L 29/66 | (2006.01) | |
| H01L 29/08 | (2006.01) | |
| H01L 29/06 | (2006.01) | |
| H01L 21/268 | (2006.01) | |
| H01L 21/324 | (2006.01) | |
| H01L 21/265 | (2006.01) | |
| H01L 29/10 | (2006.01) | |
| H01L 29/32 | (2006.01) | |
| H01L 29/417 | (2006.01) | |
| H01L 29/861 | (2006.01) | |

(52) U.S. Cl.
CPC ...... *H01L 21/26513* (2013.01); *H01L 21/324* (2013.01); *H01L 29/0615* (2013.01); *H01L 29/0646* (2013.01); *H01L 29/0804* (2013.01); *H01L 29/0821* (2013.01); *H01L 29/0834* (2013.01); *H01L 29/1004* (2013.01); *H01L 29/1095* (2013.01); *H01L 29/32* (2013.01); *H01L 29/36* (2013.01); *H01L 29/41708* (2013.01); *H01L 29/49* (2013.01); *H01L 29/6609* (2013.01); *H01L 29/66333* (2013.01); *H01L 29/861* (2013.01)

(56) References Cited

U.S. PATENT DOCUMENTS

| | | |
|---|---|---|
| 2002/0130331 A1 | 9/2002 | Nemoto et al. |
| 2003/0211693 A1 | 11/2003 | Takei et al. |
| 2005/0116249 A1 | 6/2005 | Mauder et al. |
| 2006/0286753 A1 | 12/2006 | Barthelmess et al. |
| 2008/0054369 A1 | 3/2008 | Schulze et al. |
| 2008/0315364 A1 | 12/2008 | Nemoto |
| 2009/0184340 A1 | 7/2009 | Nemoto et al. |
| 2009/0283799 A1* | 11/2009 | Ruething ............ H01L 29/0834 257/143 |
| 2012/0267681 A1* | 10/2012 | Nemoto ................ H01L 21/263 257/139 |
| 2012/0286323 A1* | 11/2012 | Werber ............... H01L 29/0834 257/139 |
| 2013/0037853 A1 | 2/2013 | Onozawa |
| 2013/0092977 A1* | 4/2013 | Huesken ................. H01L 29/36 257/139 |

FOREIGN PATENT DOCUMENTS

| | | |
|---|---|---|
| JP | 427706 B2 | 5/1992 |
| JP | D627706 B2 | 4/1994 |
| JP | 2001077357 A | 3/2001 |
| JP | 2001160559 A | 6/2001 |
| JP | 2003152198 A | 5/2003 |
| JP | 2007059550 A | 3/2007 |
| JP | 2009099705 A | 5/2009 |
| JP | 2009176892 A | 8/2009 |
| WO | 0016408 A1 | 3/2000 |
| WO | 2007055352 A1 | 5/2007 |
| WO | 2011052787 A1 | 5/2011 |

OTHER PUBLICATIONS

Office Action issued in Japanese Application No. 2013-554375 dated Jan. 6, 2015.
European Search Report issued in European Application No. 13738600.9 dated Nov. 5, 2015.
Office Action issued in U.S. Appl. No. 14/301,914 dated Sep. 1, 2015.
Office Action issued in U.S. Appl. No. 14/301,914 dated Apr. 26, 2016.
Notice of Allowance issued in U.S. Appl. No. 14/301,914 dated Aug. 9, 2016.

\* cited by examiner

| RATED VOLTAGE (V) | BREAKDOWN VOLTAGE (V) | TOTAL THICKNESS OF SUBSTRATE W0 (μm) | RESISTIVITY (Ωcm) | AVERAGE CONCENTRATION OF DRIFT LAYER (/cm³) | RATED CURRENT DENSITY (A/cm²) | DISTANCE INDEX L L (μm) | FS LAYER WHICH END OF DEPLETION LAYER REACHES FIRST: DISTANCE X FROM REAR SURFACE (μm) | | | | | | | | | |
|---|---|---|---|---|---|---|---|---|---|---|---|---|---|---|---|---|
| | | | | | | | W0-0.7L | W0-0.8L | W0-0.9L | W0-1.0L | W0-1.1L | W0-1.2L | W0-1.3L | W0-1.4L | W0-1.5L | W0-1.6L |
| 600 | 700 | 60 | 30 | 1.5E+14 | 300 | 31.9 | 37.7 | 34.5 | 31.3 | 28.1 | 24.9 | 21.7 | 18.5 | 15.3 | 12.1 | 8.9 |
| 1200 | 1400 | 120 | 60 | 7.7E+13 | 200 | 58.2 | 79.2 | 73.4 | 67.6 | 61.8 | 55.9 | 50.1 | 44.3 | 38.5 | 32.7 | 26.8 |
| 1700 | 1900 | 170 | 85 | 5.4E+13 | 150 | 80.8 | 113.4 | 105.3 | 97.3 | 89.2 | 81.1 | 73.0 | 64.9 | 56.9 | 48.8 | 40.7 |
| 3300 | 3500 | 330 | 165 | 2.8E+13 | 80 | 155.0 | 221.5 | 206.0 | 190.5 | 175.0 | 159.5 | 144.0 | 128.5 | 113.0 | 97.5 | 82.0 |
| 4500 | 4700 | 450 | 225 | 2.0E+13 | 50 | 223.1 | 293.8 | 271.5 | 249.2 | 226.9 | 204.6 | 182.3 | 160.0 | 137.7 | 115.4 | 93.1 |
| 6500 | 6700 | 650 | 325 | 1.4E+13 | 30 | 337.3 | 413.9 | 380.1 | 346.4 | 312.7 | 278.9 | 245.2 | 211.5 | 177.7 | 144.0 | 110.3 |

FIG.10

SEMICONDUCTOR DEVICE AND METHOD FOR PRODUCING THE SAME

BACKGROUND OF THE INVENTION

A. Field of the Invention

The present invention relates to a semiconductor device including a field stop (FS) layer, such as a diode and an insulated gate bipolar transistor (IGBT), and a method for producing the same.

B. Description of the Related Art

As a power semiconductor device, for example, there is a diode or an IGBT with a breakdown voltage of 400 V, 600 V, 1200 V, 1700 V, 3300 V, or more. The diode or the IGBT is used in a power conversion apparatus such as a converter or an inverter. The power semiconductor device requires good electrical characteristics, such as low loss, high efficiency, and a high breakdown voltage, and low costs.

As a method for producing the power semiconductor device, the following method has been proposed. First, for example, a diffusion region or a MOS structure is formed on the front surface side of a semiconductor substrate. Then, the rear surface is ground to reduce the thickness of the semiconductor substrate. Proton implantation and a heat treatment are performed for the ground surface to form donors using composite defects including the implanted hydrogen atoms and a plurality of neighboring point defects, thereby forming a high-concentration n-type field stop layer. The donor formed by the composite defect including hydrogen is referred to as a hydrogen-induced donor.

Patent Literature 1 discloses a technique for preventing a reduction in electron/hole mobility at an irradiation position due to proton implantation. Patent Literature 2 discloses heat treatment conditions after proton implantation. Patent Literature 3 discloses an IGBT production method which uses laser annealing when a contact layer is formed after proton implantation and annealing. After the proton irradiation, annealing is performed to recover carrier concentration. Patent Literature 4 discloses a method which recovers a defect layer before proton annealing to increase the carrier concentration of protons. Patent Literature 5 discloses a method which introduces oxygen to a silicon substrate in advance, radiates protons to the front surface, performs annealing, grinds the rear surface, implants phosphorus ions into the ground surface, and performs annealing with a YAG laser. In addition, Patent Literature 5 discloses a method which prevents a reduction in the carrier mobility of a proton-implanted region due to the introduction of oxygen. Patent Literature 6 discloses a method which performs annealing with a YAG laser and a CW laser to form a proton field stop layer (proton donor generation layer) after protons are implanted into the rear surface.

CITATION LIST

Patent Literature 1: United States Patent Application, Publication No. 2005/0116249
Patent Literature 2: United States Patent Application, Publication No. 2006/0286753
Patent Literature 3: JP 2001-160559 A
Patent Literature 4: JP 2009-099705 A
Patent Literature 5: WO 2007-055352 A1
Patent Literature 6: JP 2009-176892 A A large number of defects introduced by proton implantation remain in the projected range Rp of protons (the distance of a position where the concentration of the implanted ions is the highest from an implantation surface), a proton passage region from the implantation surface to the projected range Rp, or the vicinity of the implantation surface. The remaining defects are referred to as residual defects. The deviation of an atom (in this case, silicon) from a lattice position is large and the state of the defect is close to an amorphous state due to the strong disorder of the crystal lattice. Therefore, the defect is the scattering center of a carrier, such as an electron or a hole, reduces carrier mobility, and increases conduction resistance. In addition, the defect is the generation center of the carrier and increases a leakage current. As such, the defect causes the deterioration of the characteristics of the element.

As such, the defect which remains in the proton passage region from the proton implantation surface to the projected range Rp of the protons due to proton implantation, causes a reduction in carrier mobility or an increase in leakage current, and is strongly disordered from the crystal state is particularly referred to as disorder. There is a method that recovers the crystal defects which are generated during proton implantation using a heat treatment in an electric furnace to form hydrogen-induced donors. In a case in which the crystal defects generated during proton implantation form the disorder, when only the heat treatment using the electric furnace is performed, the hydrogen-induced donors are formed and the disorder remains in the proton passage region. As a result, the carrier mobility is reduced, which causes deterioration of characteristics, such as an increase in leakage current or conduction loss.

As disclosed in Patent Literature 3, there is a method which anneals the proton implantation surface with a laser while cooling the MOS gate forming surface opposite to the proton implantation surface after proton implantation is performed. However, Patent Literature 3 does not disclose the remaining disorder and the influence of the remaining disorder on the characteristics of the element.

As disclosed in Patent Literature 4, there is a method which performs electron beam heating or laser heating to recover the crystal defects after proton implantation, in order to prevent the outward diffusion of protons before annealing. However, Patent Literature 4 does not disclose the remaining disorder and the influence of the remaining disorder on the characteristics of the element.

As in Patent Literature 5, when a high concentration of oxygen is introduced into the silicon substrate in advance, a process of diffusing oxygen at a high temperature (1000° C. or more) is needed. Therefore, problems, such as an increase in the number of processes increases and the occurrence of an oxidation-induced stacking faults (OSF), arise.

In Patent Literature 6, laser beams with two types of wavelengths are radiated to recover the defects in a region from the proton implantation surface to a depth of 30 μm and a long carrier lifetime is maintained. However, Patent Literature 6 does not disclose the disorder which remains in the proton passage region. In addition, even when lasers with different wavelengths are combined with each other, a temperature distribution is certainly generated in the depth direction. Therefore, it is difficult to achieve both the stable formation of the hydrogen-induced donors at an arbitrary depth and a reduction in the disorder in the vicinity of the implantation surface and in the passage region. In addition, individual laser light sources and individual laser irradiation facilities are needed in order to radiate laser beams with two different wavelengths, which results in an increase in costs.

In the method disclosed in Patent Literature 6, when the projected range Rp of the implanted protons from the implantation surface is more than 15 μm, the disorder is not sufficiently reduced in the vicinity of the implantation surface and in the passage region. FIG. 6 is a characteristic diagram illustrating the comparison among the carrier concentration distributions of the semiconductor device which is produced by the method according to the related art for each projected range. Specifically, In FIG. 6, when the projected range Rp of proton implantation is around 15 μm, the carrier concentration distributions of the sample which is formed by the method disclosed in Patent Literature 6 for each projected range Rp are compared. FIG. 6(a) shows a case in which the projected range Rp is 50 μm, FIG. 6(b) shows a case in which the projected range Rp is 20 μm, and FIG. 6(c) shows a case in which the projected range Rp is 10 μm. In FIG. 6(c) in which the projected range Rp is 10 μm, the carrier concentration in the vicinity of the implantation surface (a depth of 0 μm to 5 μm) and in the passage region is higher than the concentration, $1\times10^{14}$ (/cm$^3$), of the silicon substrate and the disorder is sufficiently reduced. As can be seen from FIG. 6(b) in which the projected range Rp is 20 μm and FIG. 6(a) in which the projected range Rp is 50 μm, the carrier concentration in the vicinity of the implantation surface and in the passage region is greatly reduced and the disorder is not reduced. As such, when the disorder remains, the leakage current or conduction loss of the element increases. Therefore, when the projected range Rp of the proton implantation is more than 15 μm, a new method for reducing the disorder needs to be examined.

The present invention is directed to overcoming or at least reducing the effects of one or more of the problems set forth above.

SUMMARY OF THE INVENTION

The invention provides a stable and inexpensive semiconductor device which includes an n-type field stop layer formed at a predetermined depth, can reduce the disorder generated by proton implantation, and can prevent deterioration of electrical characteristics, such as a reduction in carrier mobility, an increase in loss, and an increase in leakage current due to a generation center, and a method for producing the same, in order to solve the above-mentioned problems.

A semiconductor device according to the invention has the following characteristics. A p-type base layer is provided in a surface layer of a first main surface of a semiconductor substrate, which is an n-type drift layer, and has a higher concentration than the drift layer. An n-type emitter layer is provided in the base layer and has a higher concentration than the base layer. A gate insulating film is provided which contacts the base layer, the emitter layer, and the drift layer. A gate electrode is provided on a surface of the gate insulating film facing the base layer, the emitter layer, and the drift layer. An emitter electrode is provided on the surfaces of the emitter layer and the base layer and is insulated from the gate electrode by an interlayer insulating film. A p-type collector layer is provided on a second main surface of the semiconductor substrate. At least one n-type intermediate layer is provided between the drift layer and the collector layer and includes a pair of an n-type field stop layer with a higher concentration than the drift layer and an n-type disorder reduction region with a concentration which is lower than that of the field stop layer and equal to or higher than that of the drift layer.

In the semiconductor device according to the invention, the depth of a position where carrier concentration is the maximum in the field stop layer closest to the base layer from the second main surface may be more than 15 μm.

In the semiconductor device according to the invention, when q is an elementary charge, $N_d$ is the average concentration of the drift layer, $\epsilon_s$ is the permittivity of the semiconductor substrate, $V_{rate}$ is a rated voltage, $J_F$ is rated current density, and $v_{sat}$ is a saturated velocity in which a carrier speed is saturated with predetermined electric field intensity, a distance index L may be represented by the following Expression (1). When the depth of the position where the carrier concentration is the maximum in the field stop layer closest to the base layer from the second main surface is X and the thickness of the semiconductor substrate is W0, X=W0−γL may be established and γ may be in the range of 0.2 to 1.5.

$$L = \sqrt{\frac{\varepsilon_S V_{rate}}{q\left(\frac{J_F}{qv_{sat}} + N_d\right)}} \qquad \text{Expression (1)}$$

In the semiconductor device according to the invention, the field stop layer in the intermediate layer which comes into contact with the drift layer may come into contact with the drift layer. The disorder reduction region in the intermediate layer which comes into contact with the collector layer may come into contact with the collector layer.

In the semiconductor device according to the invention, two or more intermediate layers may be formed.

In the semiconductor device according to the invention, a minimum value of carrier mobility in the disorder reduction region may be equal to or more than 20% of the carrier mobility in a crystal state.

In order to solve the above-mentioned problems, a method for producing a semiconductor device according to the invention has the following characteristics. Proton implantation is performed from one main surface of a semiconductor substrate. Then, the entire semiconductor substrate is heated at a high temperature to form a hydrogen-induced donor using the proton implantation, thereby forming an n-type field stop layer in the semiconductor substrate. A portion of the semiconductor substrate corresponding to the projected range of the implanted protons from the one main surface is heated to reduce a disorder generated in a proton passage region, thereby forming an n-type disorder reduction region.

In the method for producing a semiconductor device according to the invention, a process of heating the entire semiconductor substrate at a high temperature may be a furnace annealing process, and the field stop layer may be formed by the furnace annealing process. In addition, a process of heating the portion of the semiconductor substrate corresponding to the projected range of the implanted protons from the one main surface may be a laser annealing process of radiating laser light to the one main surface. The disorder reduction region may be formed by the laser annealing process.

In the method for producing a semiconductor device according to the invention, the formation of the field stop layer and the formation of the disorder reduction region may be performed after a rear surface of the semiconductor substrate is ground and before a rear electrode is formed.

In the method for producing a semiconductor device according to the invention, the formation of the field stop layer may be performed after the proton implantation is performed and before the disorder reduction region is formed.

In the method for producing a semiconductor device according to the invention, the formation of the disorder reduction region may be performed after the proton implantation is performed and before the field stop layer is formed.

In the method for producing a semiconductor device according to the invention, the temperature of the furnace annealing process may be equal to or higher than 350° C. and equal to or lower than 550° C. The processing time of the furnace annealing process may be equal to or more than 1 hour and equal to or less than 10 hours.

In the method for producing a semiconductor device according to the invention, a YAG laser or a semiconductor laser may be used in the laser annealing process.

In the method for producing a semiconductor device according to the invention, after the proton implantation and before the laser annealing process, impurity ions may be implanted into a surface layer of the one main surface which is shallower than the of the implanted protons and the impurity may be activated by the laser annealing process.

In the method for producing a semiconductor device according to the invention, when the field stop layer with a Rp of the implanted protons is formed, the acceleration energy E of the protons may satisfy the following Expression (2).

$$y=-0.0047x^4+0.0528x^3-0.2211x^2+0.9923x+5.0474. \quad \text{Expression (2)}$$

A semiconductor device according to the invention is an IGBT including the field stop layer.

A semiconductor device according to the invention is an FWD including the field stop layer.

According to the invention, after the proton implantation, the hydrogen-induced donor is formed by the furnace annealing process to form the n-type field stop layer. In addition, the disorder generated in the proton passage region is reduced by the laser annealing process to form the disorder reduction region. The formation of the disorder reduction region makes it possible to prevent deterioration of electrical characteristics, such as an increase in the conduction resistance or leakage current of a semiconductor device. As a result, it is possible to provide a stable and inexpensive semiconductor device and a method for producing the same.

BRIEF DESCRIPTION OF THE DRAWINGS

The foregoing advantages and features of the invention will become apparent upon reference to the following detailed description and the accompanying drawings, of which:

FIG. 10 is a table illustrating the position conditions of a field stop (FS) layer which a depletion layer reaches first in the semiconductor device according to the invention.

DETAILED DESCRIPTION OF SPECIFIC EMBODIMENTS

Figure 1:
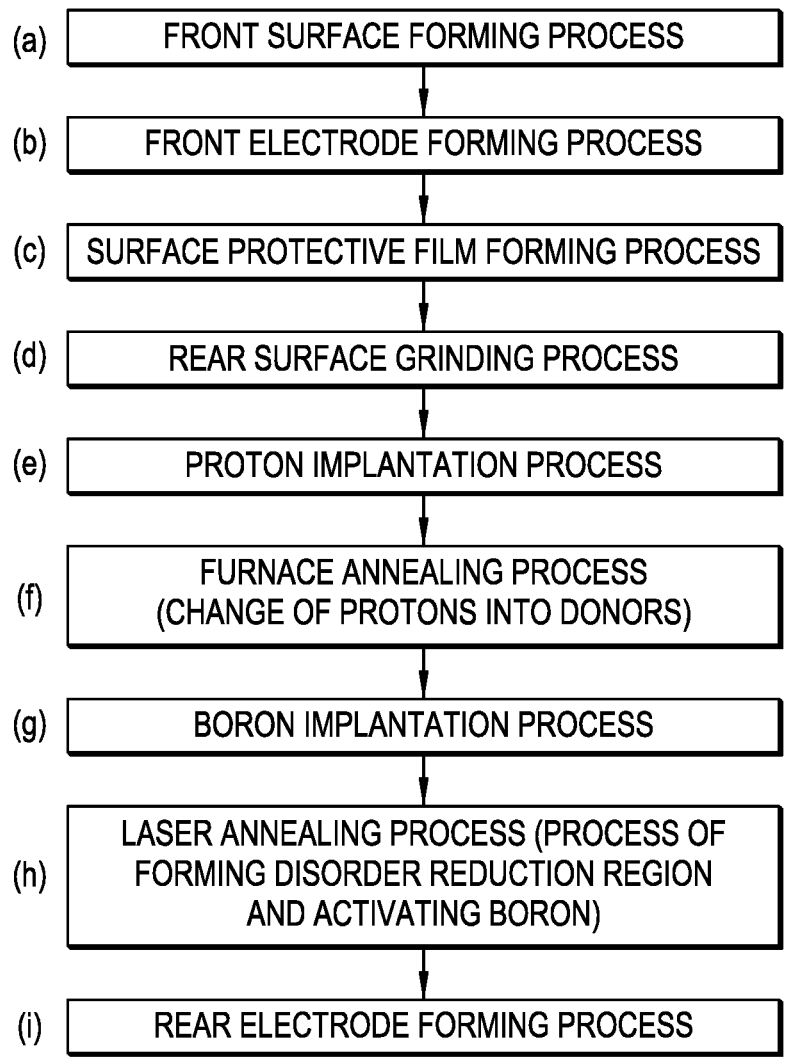
FIG. 1 is a process flow diagram illustrating a method for producing a semiconductor device (IGBT 100) according to Embodiment 1 of the invention.

Hereinafter, a semiconductor device and a method for producing the same according to exemplary embodiments of the invention will be described in detail with reference to the accompanying drawings. In the specification and the accompanying drawings, in the layers or regions having "n" or "p" appended thereto, an electron or a hole means a majority carrier. That is, "n" indicates an n type and "p" indicates a p type. In the description of the following embodiments and the accompanying drawings, the same components are denoted by the same reference numerals and the description thereof will not be repeated.

Embodiment 1

Figures 3A, 3B:
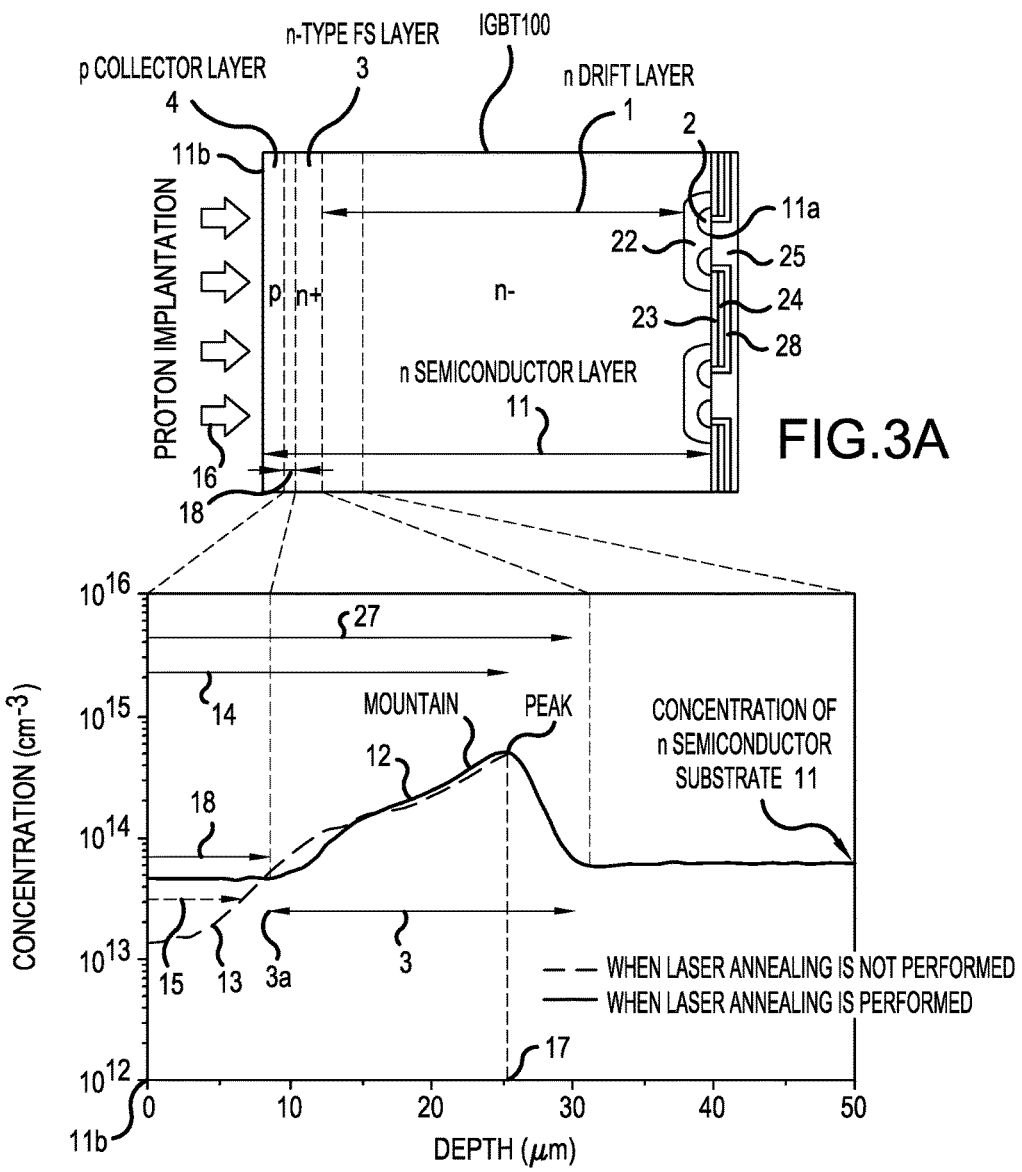
FIG. 3A is a cross-sectional view illustrating a main portion of the IGBT 100 produced by the process flow of FIG. 1
FIG. 3B is a diagram illustrating the carrier concentration profile in the vicinity of the n-type field stop layer 3.

FIG. 1 is a process flow diagram illustrating a method for producing a semiconductor device (IGBT 100) according to Embodiment 1 of the invention. FIG. 3A is a cross-sectional view illustrating a main portion of the IGBT 100 produced by the process flow shown in FIG. 1 and FIG. 3B is a diagram illustrating a carrier concentration profile in the vicinity of an n-type field stop layer 3. Next, the method for producing the semiconductor device according to Embodiment 1 of the invention will be described with reference to the process flow of FIG. 1 and the cross-sectional view of FIG. 3A.

First, in a front surface forming process shown in (a) of FIG. 1, a MOS gate structure including, for example, a p base layer 22, an n emitter layer 2, a gate insulating film 23, a gate electrode 24, and an interlayer insulating film 28 is formed on one main surface (front surface 11a) of an n semiconductor substrate (wafer) 11. However, the n emitter layer 2 is formed in the p base layer 22. The configuration of the MOS gate structure will be described below.

Then, in a front electrode process shown in (b) of FIG. 1, an emitter electrode 25, which is a metal film that commonly comes into conductive contact with the surfaces of both the p base layer 22 and the n emitter layer 2 and is also a surface electrode, is formed. Examples of the metal material forming the emitter electrode 25 include Al (aluminum), an Al alloy, such as Al—Si (silicon) or Al—Cu (copper), Cu, Au (gold), and Ni (nickel).

Then, in a surface protective film forming process shown in (c) of FIG. 1, a surface protective film which protects a front surface 11a is formed. The surface protective film is made of a protective tape, a photoresist, or polyimide. Then, in a rear surface grinding process shown in (d) of FIG. 1, a rear surface 11b of the n semiconductor substrate 11 (n drift layer 1) is ground (back grinding) to a predetermined thickness which is determined by the relationship with a breakdown voltage.

In a proton implantation process shown in (e) of FIG. 1, proton implantation 16 is performed from a rear surface 11b. The irradiation energy of the proton implantation 16 is selected to form the n-type field stop layer 3 at a predetermined depth. The projected range Rp of the implanted protons from the rear surface 11b (ground surface) is deeper than 15 μm. In some cases, the projected range Rp is in the projected range of 20 μm to 400 μm, depending on the rated voltage. Specifically, the projected range Rp of the implanted proton from the rear surface 11b (the ground surface) is, for example, in the projected range of 20 μm to 60 μm. The depth of the FS layer, which is formed at the deepest position from the rear surface 11b, according to the rated voltage will be described below.

In a furnace annealing process shown in (f) of FIG. 1, furnace annealing is performed to the n-type field stop layer 3 using the change of protons into donors. The furnace annealing process puts a wafer into a constant-temperature furnace, such as an electric furnace with a constant temperature and performs a heat treatment to heat the entire wafer. The processing temperature of the furnace annealing process is in the range of 350° C. to 550° C. and the processing time is in the range of 1 to 10 hours. In the temperature range, crystal defects remain in the projected range Rp of protons and a proton passage region 14 and the formation of hydrogen-induced donors by the proton implantation 16 is accelerated. In addition to the furnace annealing, for example, lamp annealing may be used to heat the entire wafer. In the temperature range, disorder which is introduced by the proton implantation 16 also remains in the proton passage region 14 (a region from a proton implantation surface to the projected range Rp) to form a disorder region 15. The remaining disorder is the generation center of carriers which cause a reduction in the mobility of the carriers or a leakage current.

In a boron implantation process shown in (g) of FIG. 1, boron ions are implanted into the rear surface 11b. The boron ion implantation is performed for a surface layer of the rear surface 11b such that the projected range (Rp) of the protons from the rear surface is shallow.

In a laser annealing process shown in (h) of FIG. 1, laser light is radiated to the rear surface 11b for which the proton implantation 16 has been performed to reduce the disorder which remains in the furnace annealing, thereby forming an n-type disorder reduction region 18, and to activate the boron implanted into the shallow portion from the rear surface 11b, thereby forming a p collector layer 4. The laser annealing process heats the projected range Rp of the protons radiated to the rear surface 11b using, for example, a YAG laser. The pulse width (half width) of the laser light is in the range of, for example, 300 ns to 800 ns and the laser light is radiated to the same portion several times. The temperature of silicon in the irradiation portion is about 3000° C., but a heating time and a cooling time are very short (an order of 10 ns to 1 μs).

The penetration depth of the laser light is within the penetration depth (projected range Rp) of the protons. Specifically, the wavelength of the laser light is selected such that the penetration depth is from the position of the base (the end 3a of the n-type field stop layer 3 close to the rear surface 11b) of a mountain (convex portion) with the peak of donor generation concentration (carrier concentration) by the protons, which is close to the rear surface 11b, to a proton implantation surface (rear surface 11b) (a portion of the proton passage region 14). It is preferable that the wavelength of the laser light be in the range of 10 μm to 1000 μm. In this case, it is possible to effectively perform the formation of the n-type disorder reduction region 18 and the activation of the boron at the same time. The temperature of the portion irradiated with the laser light is equal to or higher than 1000° C. In this case, it is possible to effectively form the n-type disorder reduction region 18. It is preferable that the temperature be equal to or higher than 2000° C. and equal to or lower than the boiling point (3266° C.) of Si. In particular, the temperature is not higher than the melting point of silicon. In this case, it is possible to prevent the ablation (surface roughness) of the irradiation surface after laser irradiation. In addition, a lamp annealing process may be performed, instead of the laser annealing process. The above-mentioned process makes it possible to form the n-type disorder reduction region 18 between the proton implantation surface and the projected range (Rp).

In a rear electrode forming process shown in (i) of FIG. 1, a collector electrode (not shown) which comes into conductive contact with the surface of the p collector layer 4 is formed by, for example, vacuum sputtering. In this way, the IGBT 100 according to the invention is completed. After the sputtering is performed, a metal annealing process is performed, if necessary. As such, the point of the production method according to this embodiment is to perform both the furnace annealing process and the laser annealing process. The effect of this method will be described below.

Figure 11A:
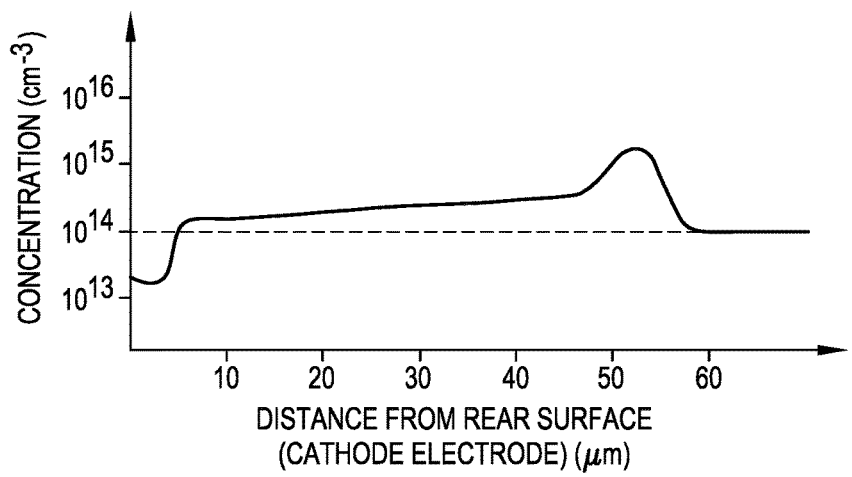
FIGS. 11A, 11B and 11C are graphs illustrating the comparison among the carrier concentration distributions of a sample which is formed only by furnace annealing for each projected range of proton implantation when the projected range is around 15 μm.
Figure 11B:
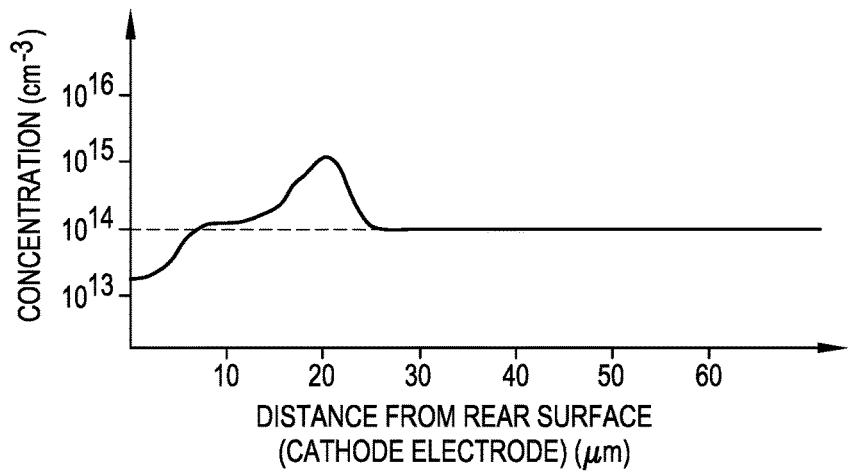
Figure 11C:
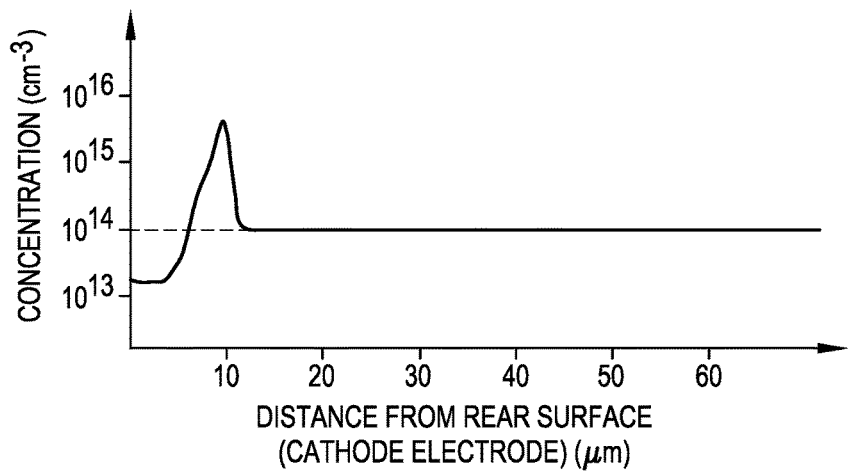

FIG. 11 shows graphs illustrating the comparison among the carrier concentration distributions for each projected range Rp of the proton implantation which is around 15 μm when a sample is formed only by furnace annealing. FIG. 11A shows a case in which the projected range Rp is 50 μm, FIG. 11B shows a case in which the projected range Rp is 20 μm, and FIG. 11C shows a case in which the projected range Rp is 10 μm. The furnace annealing temperature is 400° C. As shown in FIG. 11, when only the furnace annealing is performed, the carrier concentration is greatly reduced at a depth of about 5 μm from the implantation surface in any projected range Rp. Thus, as can be seen from FIG. 11, when only the furnace annealing is performed, a disorder remains at a depth of about 5 μm from the implantation surface, and it is difficult to recover carrier mobility in a region in the vicinity of the implantation surface when only the furnace annealing is performed.

Figure 2:
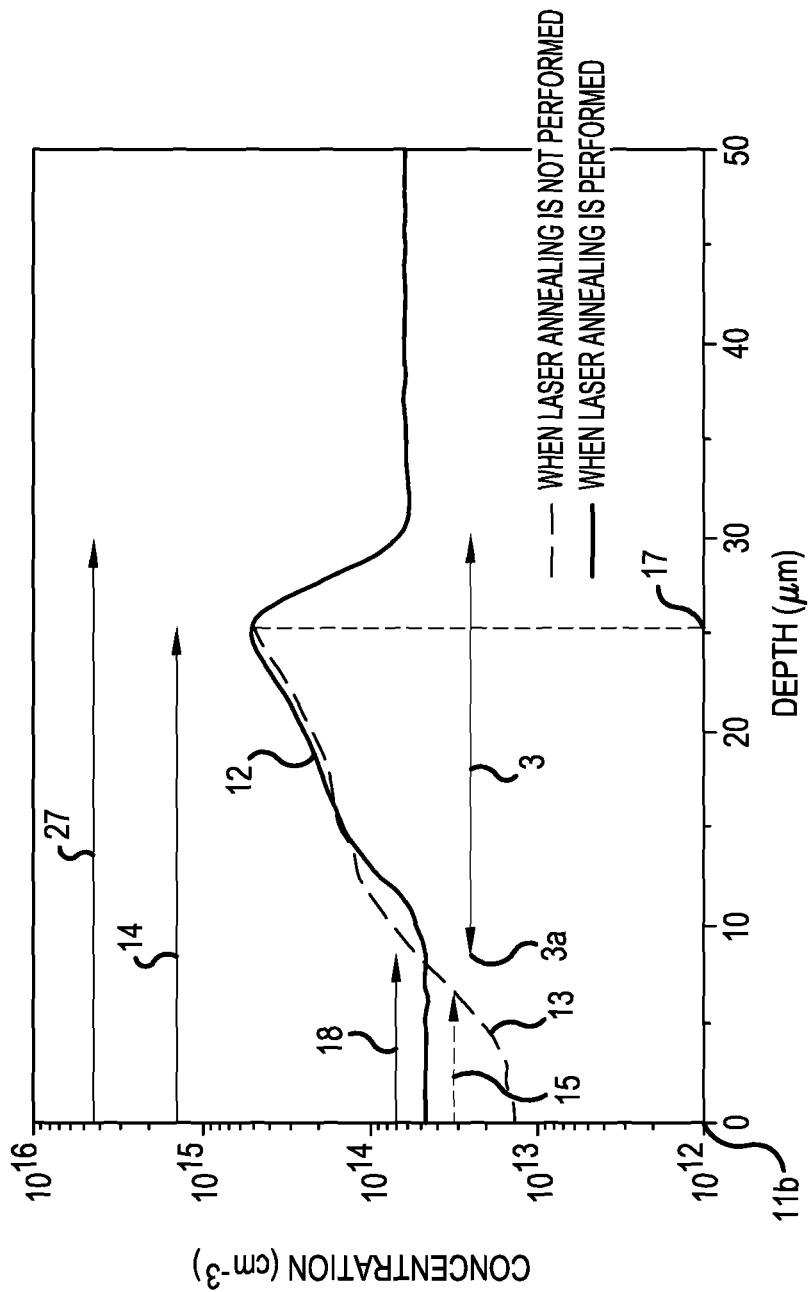
FIG. 2 is a diagram illustrating carrier concentration profiles 12 and 13 in the vicinity of an n-type field stop layer 3 when a laser annealing process is performed and when the laser annealing process is not performed, respectively.

As described above, when the laser annealing process is performed after the furnace annealing process for changing the protons into donors is performed, it is possible to effectively form the hydrogen-induced donors and reduce the disorder which remains in the furnace annealing. It is possible to form the n-type disorder reduction region 18. On the other hand, the furnace annealing process alone is insufficient to reduce disorder and the laser annealing process alone is insufficient to form the hydrogen-induced donor. FIG. 2 shows the verification results of the carrier concentration profile in the vicinity of the n-type field stop layer 3 when the laser annealing process is performed and when the laser annealing process is not performed.

FIG. 2 shows carrier concentration profiles 12 and 13 in the vicinity of the n-type field stop layer 3 when the laser annealing process is performed and when the laser annealing process is not performed, respectively. After proton implantation is performed for the silicon substrate, the furnace annealing process (here, 400° C.) is performed. Then, the disorder which remains in the furnace annealing is reduced by the laser annealing process to form the n-type disorder reduction region 18. The carrier concentration profile 12 shown in FIG. 2 is obtained after the n-type disorder reduction region 18 is formed. For comparison, the carrier concentration profile 13 when the laser annealing process is not performed and the disorder remains is represented by a dotted line. The projected range Rp of protons is 25 μm and the corresponding acceleration energy of the protons is 1.35 MeV. The energy density of the laser annealing process is 2.8 J/cm².

In the carrier concentration profile 13 when the laser annealing process is not performed, a disorder region 15 is spread in a region (a portion of the proton passage region 14) between the base (that is, the end 3a of the n-type field stop layer 3 close to the rear surface 11b) of the peak (mountain), which is the projected range 17 (Rp) of the proton, to the proton implantation surface (rear surface 11b). The end 3a of the base of the peak (mountain) close to the rear surface 11b is at a depth of about 5 μm from the implantation surface. When the disorder region 15 is formed, the mobility of electrons and holes in the region is reduced. Therefore, apparently, the carrier concentration of the disorder region 15 is reduced (the resistance thereof increases). In addition, the disorder is the generation center of carriers and the leakage current increases when a voltage is applied.

In the carrier concentration profile 12 when the laser annealing process is performed, the carrier concentration of a portion of the proton passage region 14 from the implantation surface (rear surface 11b) to the end 3a of the n-type field stop layer 3 close to the rear surface 11b is substantially equal to the concentration of the silicon substrate which is deeper than the projected range 17. That is, the disorder which remains in the proton passage region 14 when only the furnace annealing process is performed is reduced by both the laser annealing process and the furnace annealing process. The region in which the disorder is reduced is referred to as the n-type disorder reduction region 18. In addition, a pair of one n-type field stop layer 3 and one n-type disorder reduction region 18 which is adjacent to the implantation surface is referred to as an n-type intermediate layer 27.

Next, the difference between the n-type disorder reduction region 18 in the carrier concentration profile 12 when the laser annealing process is performed and the disorder region 15 in the carrier concentration profile 13 when the laser annealing process is not performed will be described. In FIG. 2, as described above, it is apparent that the carrier concentration is reduced in the disorder region 15. That is, in the carrier concentration profile 13 when the laser annealing process is not performed which is represented by a dotted line in FIG. 2, it is apparent that the carrier concentration is reduced in the disorder region 15 before the n-type field stop layer 3 is formed (at a position shallower than the n-type field stop layer 3 from the rear surface). The apparent reduction in the carrier concentration is caused by a conversion method which calculates resistivity from the spreading resistance measured by the known spreading resistance method (SR method) and converts the resistivity into carrier concentration. That is, in the disorder region 15 in which a crystal lattice is disordered, electrons or holes are scattered by strong disorder, which results in a reduction in the mobility of the carriers.

In general, in the measurement device, a theoretical value in a crystal state is set to the value of carrier mobility. Therefore, the calculation of carrier concentration is affected by a reduction in the mobility of carriers by the disorder region 15 as follows. For example, the electron mobility of silicon at room temperature (about 300K) is 1360 (cm²/V·s) and the hole mobility thereof is 495 (cm²/V·s). The mobility of carriers does not contribute to converting spreading resistance into resistivity. A conversion expression for converting resistivity into carrier concentration is represented by $\rho=1/(\mu \cdot q \cdot N)$ (where N is carrier concentration (cm$^{-3}$) and $\rho$ is resistivity ($\Omega \cdot$cm)). In addition, $\mu$ is the mobility of electrons or holes (cm²/V·s) and q is an elementary charge ($1.6 \times 10^{-19}$ C). In the conversion expression, when the resistivity $\rho$ is a constant value $\rho_0$ and an ideal mobility value in the crystal state which is greater than the reduced mobility is substituted into the position where the reduced mobility will be originally substituted, carrier concentration N is calculated to be small since the resistivity $\rho_0$ is a constant value. This appears as an apparent reduction in carrier concentration in the carrier concentration profile 13 when the laser annealing process is not performed as shown in FIG. 2. Therefore, as in the invention, when the disorder of the disorder region 15 which is formed in the proton passage region 14 on the side of the rear surface 11b is reduced by the laser annealing process to form the n-type disorder reduction region 18, electrical characteristics, such as a leakage current, are improved.

As described above, the furnace annealing process is needed in order to increase the donor generation rate of the hydrogen-induced donor. In addition to the furnace annealing process, the laser annealing process is needed in order to reduce the disorder which remains in the proton passage region 14 and to form the n-type disorder reduction region 18. When the temperature of the furnace annealing process is too high, a reduction in the disorder generated by proton implantation is accelerated, but the number of crystal defects required to form the hydrogen-induced donors using protons is insufficient. As a result, the donor generation rate is reduced. Therefore, the furnace annealing process may be performed in the above-mentioned temperature range and the processing time range.

When energy density in the laser annealing process is too high, ablation occurs and the rear surface is roughened. It is preferable that the pn junction plane of the p collector layer be flat. When roughness occurs, the pn junction plane corresponds to the shape of the roughness. On the other hand, when the energy density is two low, the disorder in the vicinity of the implantation surface (a depth of 5 μm from the implantation surface) is not sufficiently removed, but remains. As a result, carrier mobility is reduced. The results of the inventors' research proved that the sum of the energy density of the laser irradiation surface in laser annealing was preferably equal to or greater than 1 J/cm² and equal to or less than 4 J/cm².

FIG. 2 verifies to what extent the carrier mobility in the n-type disorder reduction region 18 can be recovered. In FIG. 2, the carrier concentration of the n semiconductor substrate 11 is about $6 \times 10^{13}$ (/cm³). In contrast, when the laser annealing process is performed, the carrier concentration of a portion (a portion of the proton passage region) from the implantation surface to a depth of 5 μm is about $5 \times 10$ (/cm³) and is recovered up to 83% of the substrate concentration. That is, this shows that the carrier mobility is recovered up to about 83% of the theoretical value of a crystal. On the other hand, when the laser annealing process is not performed (only the furnace annealing process is performed), the carrier mobility is about $1.2 \times 10^{13}$ (/cm$^3$) in the implantation surface with the lowest carrier concentration and is reduced to about 20%. The minimum value of the carrier mobility in the n-type disorder reduction region 18 depends on the reduction state of conduction loss (the saturated voltage $V_{CE}$(sat) of the IGBT). The minimum value of the carrier mobility is equal to or greater than 20% of the theoretical value of the crystal state and preferably equal to or greater than 50% of the theoretical value. In this case, the influence of the minimum value of the carrier mobility is negligible, as compared to the conduction loss when the carrier mobility is not reduced. In addition, the upper limit of the minimum value of the carrier mobility in the n-type disorder reduction region 18 is preferably 100% of the theoretical value of the crystal state.

It is preferable that the temperature of the furnace annealing process be equal to or higher than 350° C. and equal to or lower than 550° C. When the temperature is lower than 350° C., disorder remains in the entire proton implantation region from the implantation surface to the projected range Rp and the minimum value of the carrier mobility is less than 10%. On the other hand, when the temperature is equal to or higher than 550° C., the hydrogen-induced donor disappears. The temperature is more preferably equal to or higher than 380° C. and equal to or lower than 450° C., and most preferably equal to or higher than 400° C. and equal to or lower than 420° C. In this case, it is possible to achieve both the formation of the hydrogen-induced donor and the suppression of a reduction in carrier mobility.

In some cases, the carrier concentration of the n-type disorder reduction region 18 is lower than the concentration of the n-type field stop layer 3 and is higher than the concentration of the n semiconductor substrate 11. This is because the hydrogen ion remaining in the proton passage region 14 and the neighboring point defect form a composite defect. In this case, when the concentration of the proton passage region 14 is equal to or higher than the concentration of the n semiconductor substrate 11, disorder is reduced in the n-type disorder reduction region 18.

The IGBT 100 produced by the process flow shown in FIG. 1 will be described in detail with reference to FIG. 3. As described above, the p base layer 22 is formed in the front surface 11a of the n semiconductor substrate 11 and the n emitter layer 2 is formed in a surface layer of the p base layer 22. The gate electrode 24 is formed on a portion of the p base layer 22 which is interposed between the n emitter layer 2 and the n semiconductor substrate 11, with the gate insulating film 23 interposed therebetween. The gate electrode 24, the gate insulating film 23, the n semiconductor substrate 11, and the n emitter layer 2 form the MOS gate structure. The interlayer insulating film 28 is formed on the gate electrode 24 and the emitter electrode 25 which comes into conductive contact with the n emitter layer 2 and the p base layer 22 is formed on the interlayer insulating film 28.

Figures 12A, 12B:
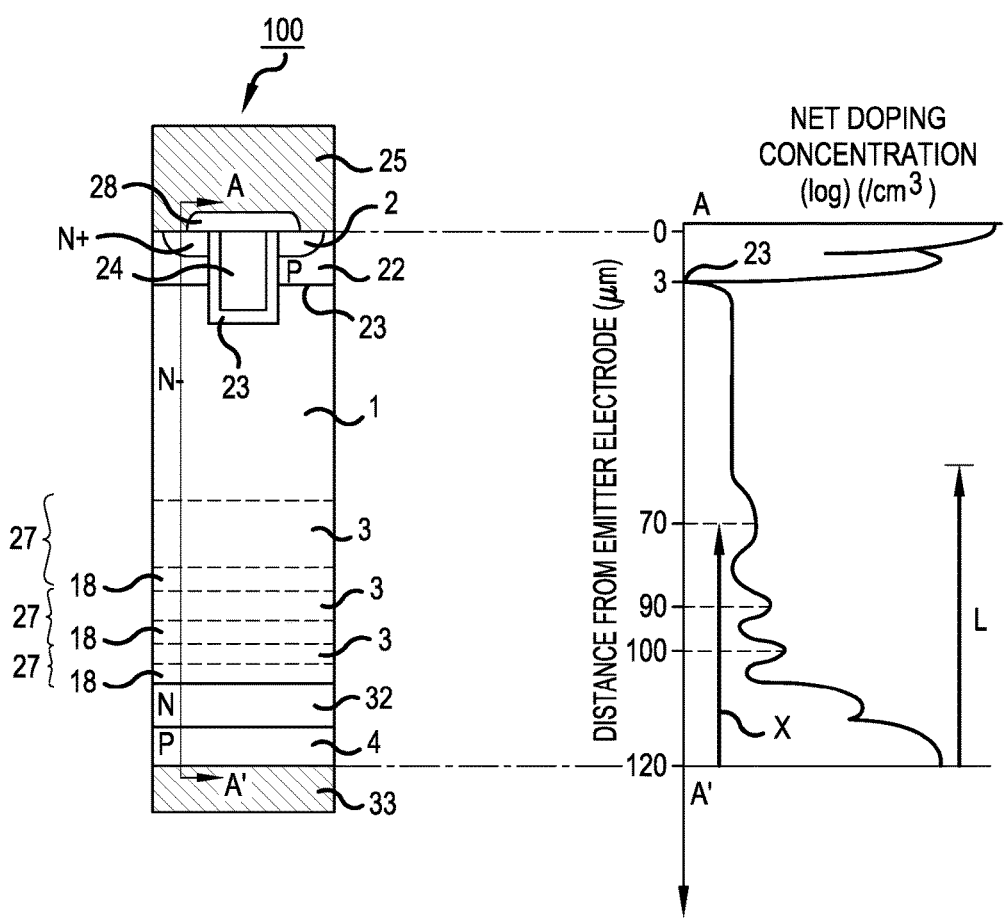
FIGS. 12A and 12B are cross-sectional views illustrating an IGBT according to the invention.

The n-type field stop layer 3 with a higher carrier concentration than the n semiconductor substrate 11 is formed in the rear surface 11b of the n semiconductor substrate 11 by proton implantation and furnace annealing. The p collector layer 4 and the n-type disorder reduction region 18 are formed at a position that is shallower than the n-type field stop layer 3 by boron ion implantation and a laser annealing process for reducing disorder. A collector electrode (not shown) is formed on the p collector layer 4. In this way, the IGBT 100 is completed. However, the n semiconductor substrate 11 from the n-type field stop layer 3 to the p base layer 22 is the n drift layer 1 in which the main current flows to maintain the main breakdown voltage. The cross-sectional view of the formed IGBT 100 is shown in FIG. 12. FIG. 12 is a cross-sectional view illustrating the IGBT according to the invention. A leakage stop layer 32 with concentration that is higher than that of the n-type field stop layer 3 and is lower than that of the p collector layer 4 may be formed between the p collector layer 4 and the n-type disorder reduction region 18. The leakage stop layer 32 is formed by, for example, phosphorus ion implantation.

As described above, the n-type field stop layer 3 of the IGBT 100 is formed by performing the proton implantation 16 from the rear surface 11b and performing the furnace annealing process such that an appropriate number of crystal defects, thereby changing protons into donors. The formation of the n-type disorder reduction region 18 by a reduction in the disorder formed by the proton passage region 14 is effectively performed by the laser annealing process of radiating laser light to the rear surface 11b. The IGBT 100 shown in FIG. 3 and the IGBT 100 shown in FIG. 12 have different MOS gate structures (FIG. 3 shows a planar gate structure and FIG. 12 shows a trench gate structure). However, when the n-type intermediate layer 27 formed by a pair of the n-type field stop layer 3 and the n-type disorder reduction region 18 is formed in the rear surface 11b, the two structures have the same effect. The structure which includes two or more n-type intermediate layers 27 as shown in FIG. 12 will be described below. In FIG. 12, similarly to FIG. 3, reference numeral 22 denotes a p base layer, reference numeral 23 denotes a gate insulating film, reference numeral 24 denotes a gate electrode, reference numeral 25 denotes an emitter electrode, and reference numeral 28 denotes an interlayer insulating film. In addition, reference numeral 33 denotes a collector electrode.

Embodiment 2

Figure 4:
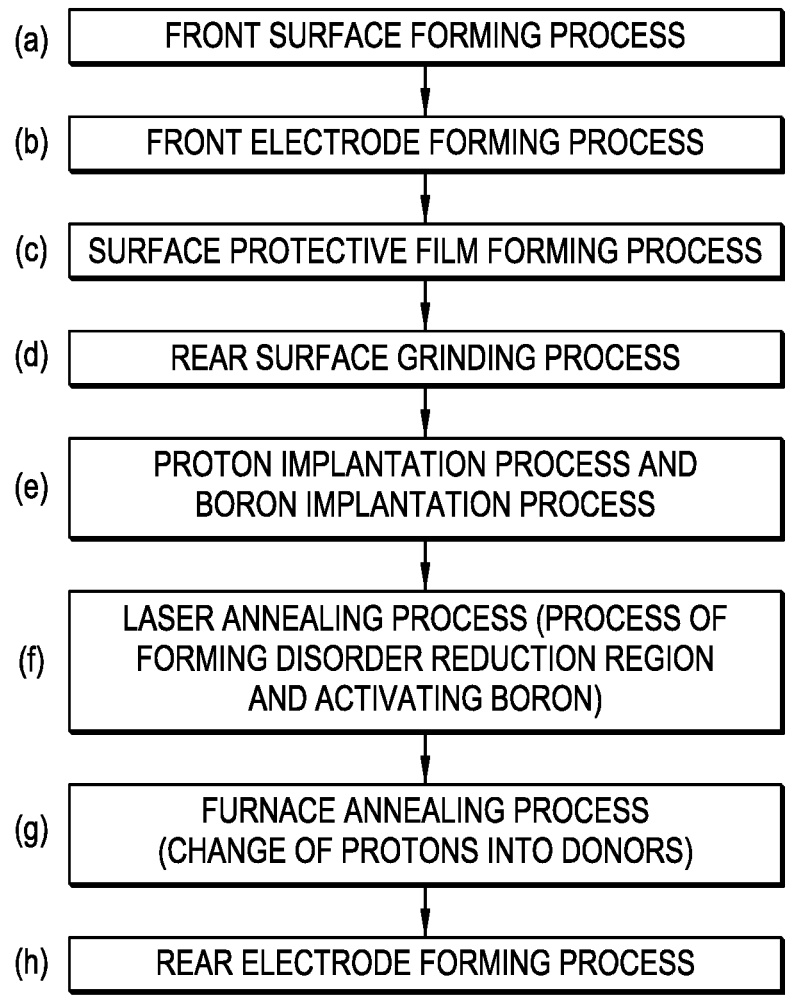
FIG. 4 is a process flow diagram illustrating a method for producing a semiconductor device according to Embodiment 2 of the invention.

A semiconductor device according to Embodiment 2 will be described. FIG. 4 is a process flow illustrating a method for producing the semiconductor device according to Embodiment 2 of the invention.

Embodiment 2 differs from Embodiment 1 in that proton implantation is followed by boron implantation (a process (e) of FIG. 4) and then a laser annealing process (a process (f) of FIG. 4) and a furnace annealing process (a process (g) of FIG. 4) are sequentially performed. In this case, in the laser annealing process which is performed first, boron is activated to form the p collector layer 4 at the same time as the n-type disorder reduction region 18 is formed in the proton passage region 14 formed by the proton implantation 16. In the furnace annealing process, which is a post-process, protons are changed into donors to form the n-type field stop layer 3. In this case, similarly to Embodiment 1, the n-type disorder reduction region 18 is formed by a combination of the laser annealing process and the furnace annealing process and the donor generation rate increases to form the n-type field stop layer 3. The formation of the n-type disorder reduction region makes it possible to improve electrical characteristics, such as the leakage current of the semiconductor device.

In the process flow shown in FIG. 1, the front surface 11a opposite to the proton implantation surface (rear surface 11b) shown in FIG. 3 is covered with a protective film, the protective film is removed after the proton implantation 16, and furnace annealing is performed. Then, a second protective film as a protective film for second boron ion implantation is formed and laser annealing is performed. That is, the protective film needs to be formed two times. In contrast, in the process flow shown in FIG. 4, after the laser annealing process, the process of removing the protective film may be performed only once. Therefore, it is possible to reduce manufacturing costs, as compared to the process flow shown in FIG. 1.

However, the semiconductor device (IGBT 100) produced by the process flow shown in FIG. 4 has the same structure as that shown in FIG. 3.

Embodiment 3

Figures 5A, 5B:
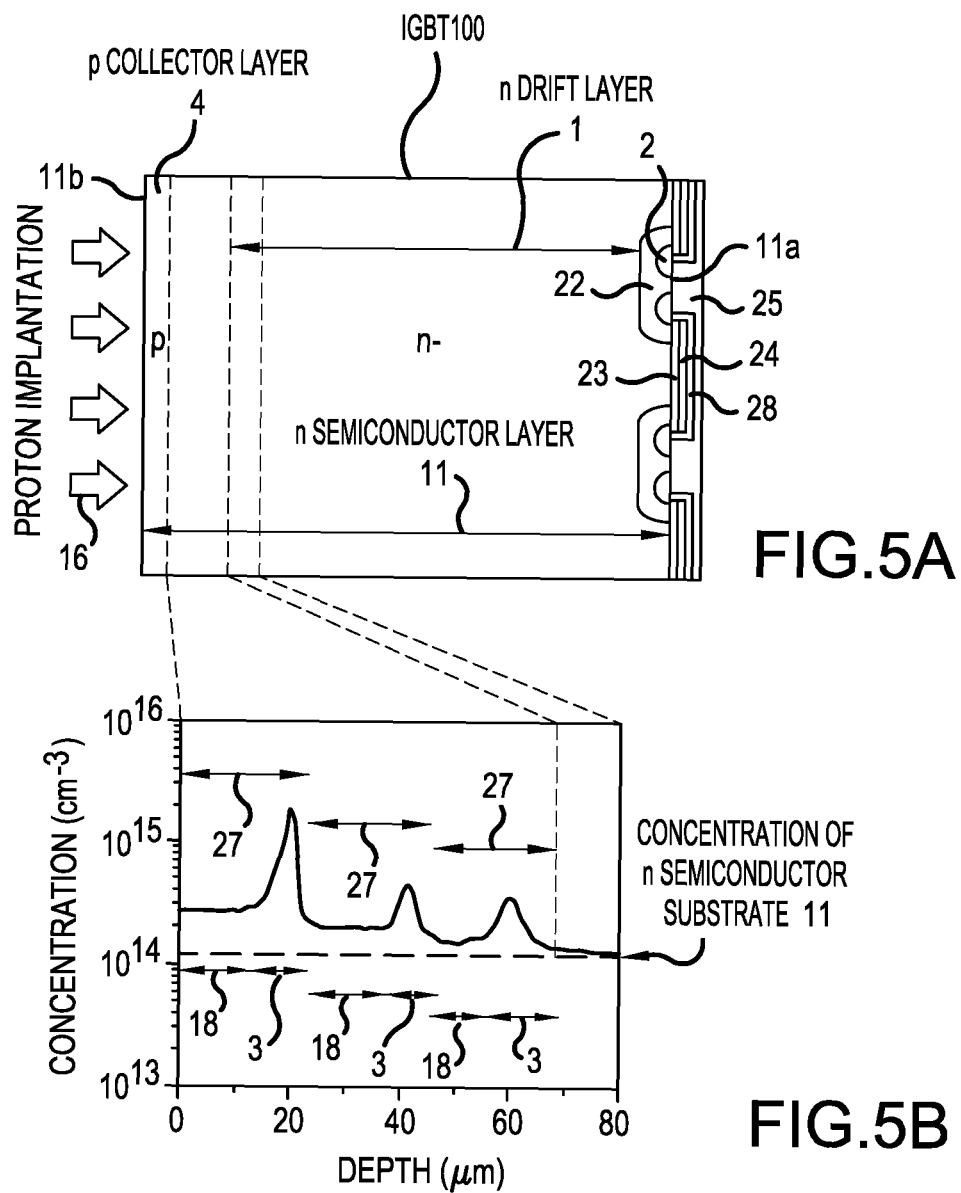
FIG. 5A is a cross-sectional view illustrating a main portion of a semiconductor device (IGBT 100) according to Embodiment 3 of the invention and FIG. 5B is a diagram illustrating the carrier concentration profile in the vicinity of an n-type field stop layer 3.
Figure 6A:
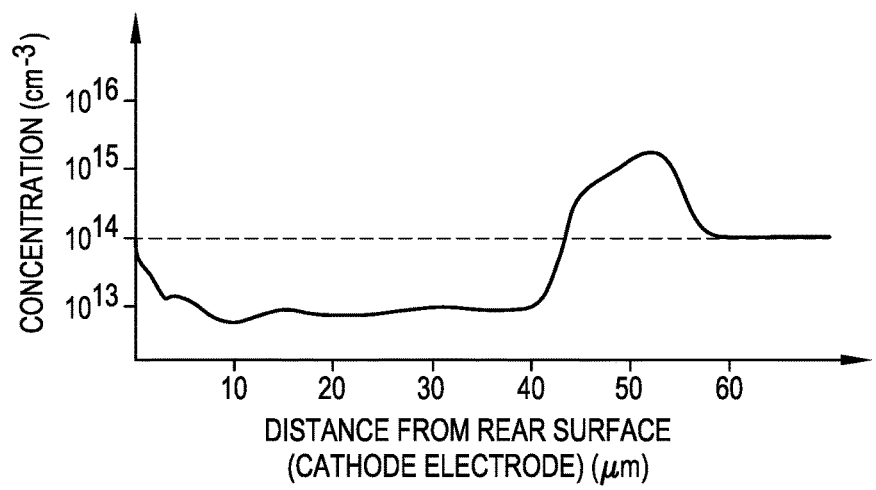
FIGS. 6A, 6B and 6C are characteristic diagrams illustrating the carrier concentration distributions of a semiconductor device produced by a method according to the related art for each projected range.
Figure 6B:
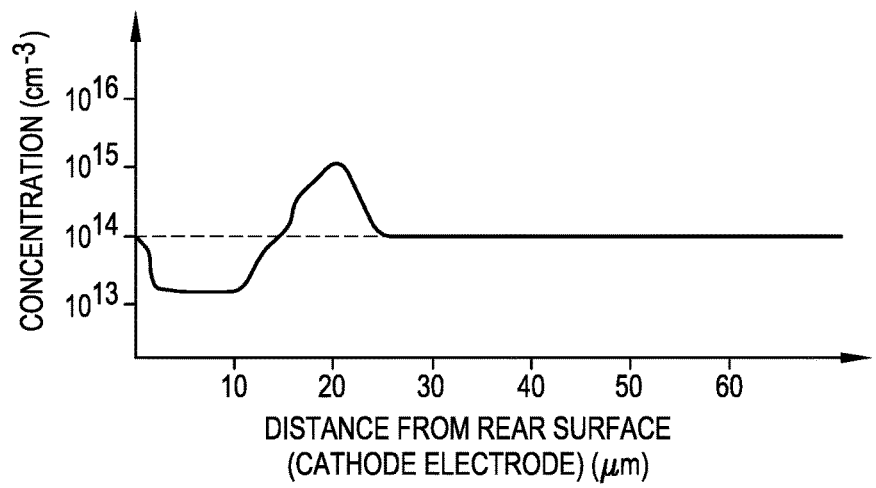
Figure 6C:
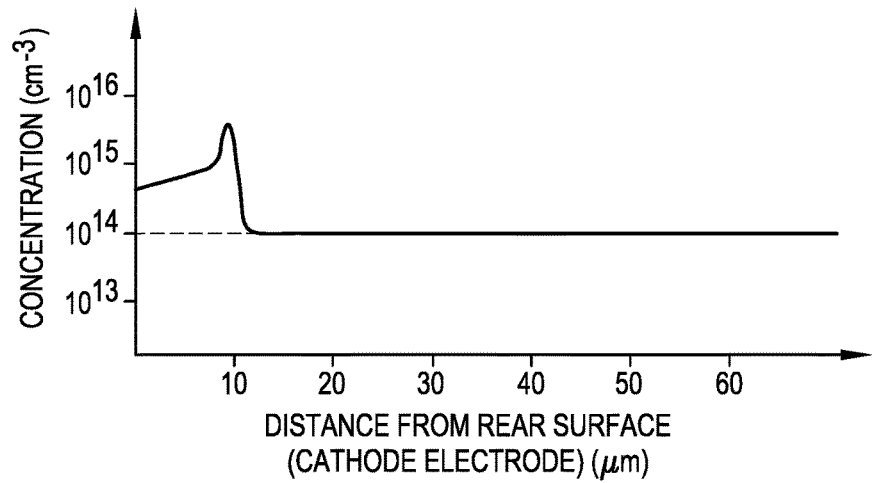

A semiconductor device according to Embodiment 3 will be described. The semiconductor device according to Embodiment 3 is an IGBT including one or more n-type intermediate layers 27 each including a pair of an n-type field stop layer 3 and an n-type disorder reduction region 18. For example, in this embodiment, three n-type intermediate layers 27 are formed. FIG. 5A is a cross-sectional view illustrating a main portion of the semiconductor device (IGBT 100) according to Embodiment 3 of the invention and FIG. 5B is a diagram illustrating a carrier concentration profile in the vicinity of the n-type field stop layer 3. As such, when a plurality of n-type intermediate layers 27 are formed, it is possible to relax the spreading of a depletion layer when the semiconductor device is turned off. Therefore, it is possible to suppress an oscillation phenomenon during switching (when the semiconductor device is turned off).

Embodiment 4

Next, the preferred position of a first proton peak in a plurality of proton irradiation operations in a method for producing a semiconductor device according to Embodiment 4 of the invention will be described.

Figure 8:
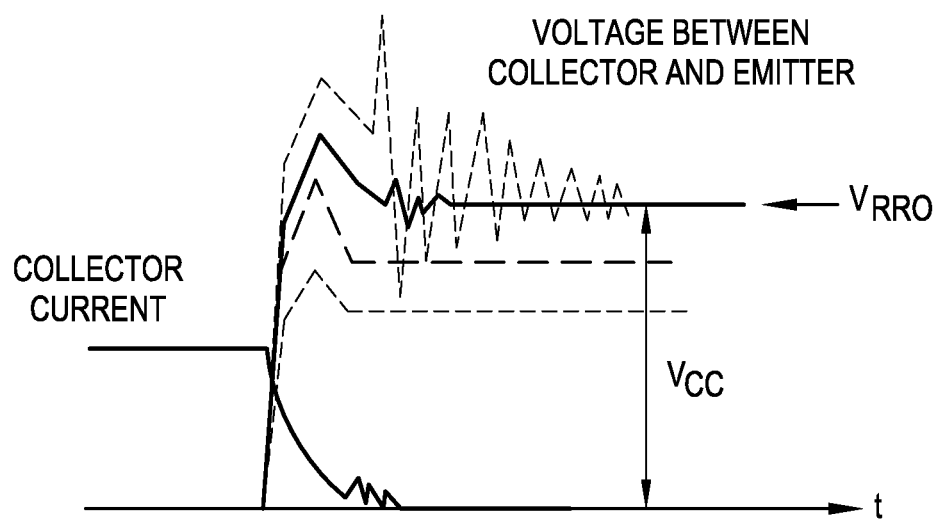
FIG. 8 is a diagram illustrating the turn-off oscillation waveform of a general IGBT.

FIG. 8 shows the turn-off oscillation waveform of a general IGBT. When a collector current is equal to or less than one-tenth of the rated current, in some cases, the number of carriers accumulated is small and oscillation occurs before the turning-off of the IGBT ends. The collector current is fixed to a certain value and the IGBT is turned off by a different power supply voltage $V_{CC}$. In this case, when the power supply voltage $V_{CC}$ is greater than a predetermined value, it is greater than the peak value of a general overshoot voltage in the voltage waveform between the collector and the emitter and an additional overshoot occurs. The additional overshoot (voltage) serves as a trigger and the subsequent waveform oscillates. When the power supply voltage $V_{CC}$ is greater than the predetermined value, the additional overshoot voltage further increases and the subsequent oscillation amplitude also increases. As such, a threshold voltage at which the voltage waveform starts to oscillate is referred to as an oscillation start threshold value $V_{RRO}$. When the oscillation start threshold value $V_{RRO}$ increases, the IGBT does not oscillate when it is turned off, which is preferable.

The oscillation start threshold value $V_{RRO}$ depends on the position of a first proton peak that a depletion layer (strictly, a space charge region since there is a hole), which is spread from the pn junction between a p base layer and an n drift layer of the IGBT to the n drift layer, reaches first, among a plurality of proton peaks. The reason is as follows. When the depletion layer is spread from the pn junction between the p base layer and the n drift layer to the n drift layer at the time the IGBT is turned off, the end of the depletion layer reaches the first field stop (FS) layer (closest to the p base layer) and the spreading of the depletion layer is suppressed. The sweep of the accumulated carriers is weakened. As a result, the depletion of the carriers is suppressed and oscillation is suppressed.

When the IGBT is turned off, the depletion layer is spread from the pn junction between the p base layer and the n drift layer (hereinafter, simply referred to as the pn junction) toward the collector electrode in the depth direction. Therefore, the peak position of the FS layer which the end of the depletion layer reaches first is the FS layer which is closest to the pn junction. Here, the thickness of the n semiconductor substrate (the thickness of a portion interposed between the emitter electrode and the collector electrode) is W0 and the depth of the peak position of the FS layer which the end of the depletion layer reaches first from the interface between the collector electrode and the rear surface of the n semiconductor substrate 11 (hereinafter, referred to as a distance from the rear surface) is X. A distance index L is introduced. The distance index L is represented by the following Expression (1).

$$L = \sqrt{\frac{\varepsilon_S V_{rate}}{q\left(\frac{J_F}{qv_{sat}} + N_d\right)}} \quad \text{Expression (1)}$$

Figure 13A:
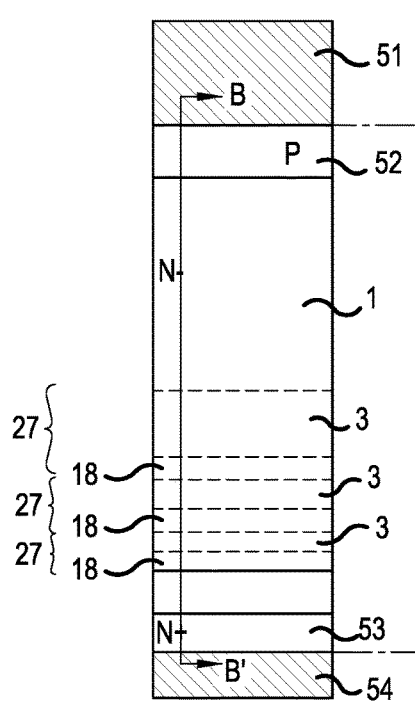
FIGS. 13A and 13B are cross-sectional views illustrating a diode according to the invention.
Figure 13B:
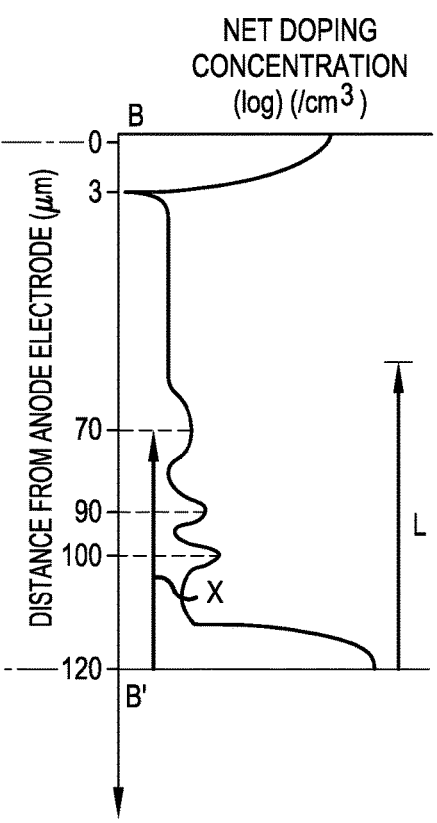

The distance index L represented by the above-mentioned Expression (1) is an index indicating the distance of the end (depletion layer end) of the depletion layer (exactly, a space charge region), which is spread from the pn junction to the n drift layer 1, from the pn junction when a voltage $V_{CE}$ between the collector and the emitter is a power supply voltage $V_{CC}$ at the time the IGBT is turned off. In a fraction in the square root, a denominator indicates the space charge density of the space charge region (depletion layer) when the IGBT is turned off. The known Poisson equation is represented by $divE=\rho/\varepsilon$, in which E is electric field intensity, $\rho$ is space charge density, and $\rho=q(p-n+N_d-N_a)$ is established. Here, q is an elementary charge, p is hole concentration, n is electron concentration, $N_d$ is donor concentration, $N_a$ is acceptor concentration, and $\varepsilon_S$ is the permittivity of a semiconductor. In particular, the donor concentration $N_d$ is average concentration obtained by integrating the n drift layer in the depth direction and dividing the integrated value by the distance of the integrated section. The net doping concentration shown in FIG. 13(b) is the net doping concentration of $N_d-N_a$ and the axis indicates the absolute value of $N_d-N_a$.

The space charge density $\rho$ is described by the hole concentration p passing through the space charge region (depletion layer) when the IGBT is turned off and the average donor concentration $N_d$ of the n drift layer. The electron concentration is lower than these concentrations so as to be negligible and there is no acceptor. Therefore, $\rho \approx q(p+N_d)$ is established. In this case, the hole concentration p is determined by a breaking current of the IGBT. In particular, since a situation in which the element is being energized is assumed, the rated current density of the element is expressed as $p=J_F/(qv_{sat})$. In addition, $J_F$ is the rated current density of the element and $v_{sat}$ is a saturated velocity in which the speed of the carrier is saturated with predetermined electric field intensity.

The Poisson equation is integrated with respect to the distance x two times and the voltage V satisfies $E=-gradV$ (the relationship between the known electric field E and the voltage V). Therefore, under appropriate boundary conditions, $V=(1/2)(\rho/\epsilon)x^2$ is established. The length x of the space charge region obtained when the voltage V is half of the rated voltage $V_{rate}$ is the distance index L. This is because an operation voltage (power supply voltage), which is the voltage V, is about half of the rated voltage in the actual device such as an inverter. Since the doping concentration of the FS layer is higher than that of the n drift layer, the FS layer prevents the expansion of the space charge region which is spread at the time the IBGT is turned off. In a case in which the collector current of the IGBT starts to be reduced from the breaking current due to the turn-off of a MOS gate, when the peak position of the FS layer which the depletion layer reaches first is in the length range of the space charge region, it is possible to suppress the expansion of the space charge region, with the accumulated carriers remaining in the n drift layer. Therefore, the sweep of the remaining carriers is suppressed.

In the actual turning-off operation, for example, when an IGBT module is driven by a known PWM inverter, the power supply voltage or the breaking current is not fixed, but is variable. Therefore, in this case, the preferred peak position of the FS layer which the depletion layer reaches first needs to have a given width. According to the results of the inventors' research, the distance X of the peak position of the FS layer which the depletion layer reaches first from the rear surface is as shown in FIG. 10. FIG. 10 is a table illustrating the position conditions of the FS (field stop) layer which the depletion layer reaches first in the semiconductor device according to the invention. FIG. 10 shows the distance X of the peak position of the FS layer which the end of the depletion layer reaches first from the rear surface at a rated voltage of 600 V to 6500 V. Here, $X=W0-\gamma L$ is established and $\gamma$ is a coefficient. FIG. 10 shows the distance X when $\gamma$ is changed from 0.7 to 1.6.

As shown in FIG. 10, at each rated voltage, the element (IGBT) is safely designed so as to have a breakdown voltage which is about 10% higher than the rated voltage. As shown in FIG. 10, the total thickness of the n semiconductor substrate (the thickness during a finishing process after the n semiconductor substrate is thinned by, for example, grinding) and the average resistivity of the n drift layer are set such that an on-voltage or turn-off loss is sufficiently reduced. The term 'average' means the average concentration and resistivity of the entire n drift layer including the FS layer. The rated current density has the typical value shown in FIG. 10 due to the rated voltage. The rated current density is set such that energy density which is determined by the product of the rated voltage and the rated current density has a substantially constant value and has nearly the value shown in FIG. 10. When the distance index L is calculated using these values according the above-mentioned Expression (1), the value shown in FIG. 10 is obtained. The distance X of the peak position of the FS layer which the end of the depletion layer reaches first from the rear surface is obtained by subtracting the product of the distance index L and $\gamma$, which is in the range of 0.7 to 1.6, from the thickness W0 of the n semiconductor substrate 11.

Figure 7:
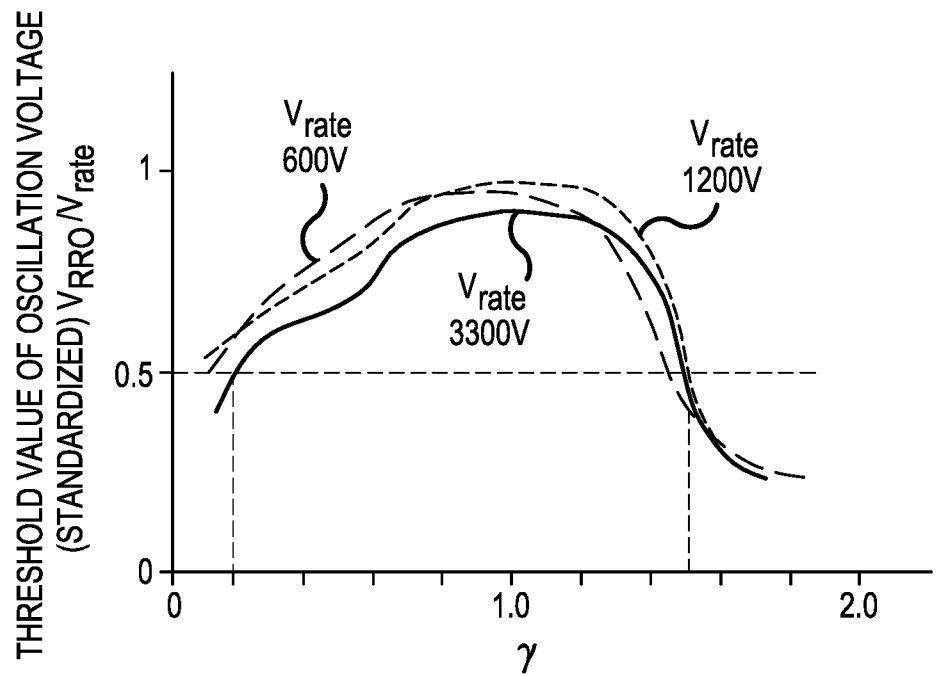
FIG. 7 is a characteristic diagram illustrating a threshold voltage at which a voltage waveform starts to oscillate.

The coefficient $\gamma$ for determining the distance X of the peak position of the FS layer which the end of the depletion layer reaches first from the rear surface, at which turn-off oscillation is sufficiently suppressed, is as follows with respect to the distance index L and the thickness W0 of the n semiconductor substrate 11. FIG. 7 is a characteristic diagram illustrating a threshold voltage at which the voltage waveform starts to oscillate. Specifically, FIG. 7 is a graph illustrating the dependence of $V_{RRO}$ on $\gamma$ at some typical rated voltages $V_{rate}$ (600 V, 1200 V, and 3300 V). In FIG. 7, the vertical axis indicates a value obtained by standardizing $V_{RRO}$ with the rated voltage $V_{rate}$. As can be seen from FIG. 7, $V_{RRO}$ can be rapidly increased at three rated voltages when $\gamma$ is equal to or less than 1.6.

As described above, in the actual apparatus, such as an inverter, since the operation voltage (power supply voltage $V_{CC}$), which is the voltage V, is about half of the rated voltage $V_{rate}$. Therefore, when $V_{CC}$ is half of $V_{rate}$, it is necessary to prevent the occurrence of at least the turn-off oscillation of the IGBT. That is, the value of $V_{RRO}/V_{rate}$ needs to be equal to or greater than 0.5. As can be seen from FIG. 7, the value of $V_{RRO}/V_{rate}$ is equal to or greater than 0.5 at $\gamma$ of 0.2 to 1.5. Therefore, it is preferable that $\gamma$ be in the range of at least 0.2 to 1.5.

At all of a rate voltage of 600 V to 1200 V (for example, 800 V or 1000 V), a rate voltage of 1200 V to 3300 V (for example, 1400 V, 1700 V, or 2500 V), and a rate voltage of 3300 V or more (for example, 4500 V or 6500 V), the value of $V_{RRO}/V_{rate}$ does not greatly from three curves and has the same dependence (the value of $V_{RRO}$ with respect to $\gamma$). As can be seen from FIG. 7, when $\gamma$ is in the range of 0.7 to 1.4, it is possible to sufficiently increase $V_{RRO}$ at any rated voltage.

When $\gamma$ is less than 0.7, the avalanche breakdown voltage of the element is likely to be lower than the rated voltage since $V_{RRO}$ is equal to or higher than about 80% of the rated voltage, but the FS layer is close to the p base layer. Therefore, it is preferable that $\gamma$ be equal to or greater than 0.7. When $\gamma$ is greater than 1.4, $V_{RRO}$ is rapidly reduced from about 70% and turn-off oscillation is likely to occur. Therefore, it is preferable that $\gamma$ be equal to or less than 1.4. In addition, $\gamma$ is more preferably in the range of 0.8 to 1.3 and most preferably in the range of 0.9 to 1.2. In this case, it is possible to maximize $V_{RRO}$ while sufficiently increasing the avalanche breakdown voltage of the element to be higher than the rated voltage.

The important point in the effect of the invention shown in FIG. 7 is that the range of $\gamma$ capable of sufficiently increasing $V_{RRO}$ is substantially the same (0.7 to 1.4) at any rated voltage. The reason is that it is most effective to set the range of the distance X of the peak position of the FS layer which the depletion layer reaches first from the rear surface to be substantially centered on W0-L (that is, $\gamma=1.0$). It is most effective to include $\gamma=1.0$ since power density (the product of the rated voltage and the rated current density) is substantially constant (for example, $1.8\times10^5$ VA/cm$^2$ to $2.6\times10^5$ VA/cm$^2$). That is, when the voltage of the element corresponds to the rated voltage during switching, such as turn-off, the distance (depth) of the end of the space charge region is about the distance index L represented by the above-mentioned Expression (1). When the peak position of the FS layer which is deepest from the rear surface is the position of L (that is, $\gamma$ is about 1.0), it is possible to suppress oscillation during switching. Since the power density is substantially constant, the distance index L is proportional to the rated voltage $V_{rate}$. Therefore, in the range having $\gamma=1.0$ as its substantial center, it is possible to sufficiently increase $V_{RRO}$ at any rated voltage $V_{rate}$. As a result, it is possible to maximize the effect of suppressing oscillation during switching.

As described above, when the distance X of the peak position of the FS layer which the end of the depletion layer reaches first is in the above-mentioned range, a sufficient number of accumulated carriers can remain in the IGBT at the time the IGBT is turned off, and it is possible to suppress the oscillation phenomenon at the time the IGBT is turned off. Therefore, for the distance X of the peak position of the FS layer which the end of the depletion layer reaches first, the coefficient γ of the distance index L may be in the above-mentioned range at any rated voltage. In this case, it is possible to effectively suppress the oscillation phenomenon when the IGBT is turned off.

As can be seen from FIG. 10, when the depth of the first FS layer, which is deepest from the rear surface, from the rear surface is about γ=1 at a rated voltage of 600 V or more as described above, the distance index L is more than a depth of 20 μm at any rated voltage. That is, the projected range Rp1 of the protons for forming the first proton peak is deeper than 15 μm from the rear surface of the substrate and is equal to or more than 20 μm in order to maximize the effect of suppressing oscillation.

Embodiment 5

Figure 9:
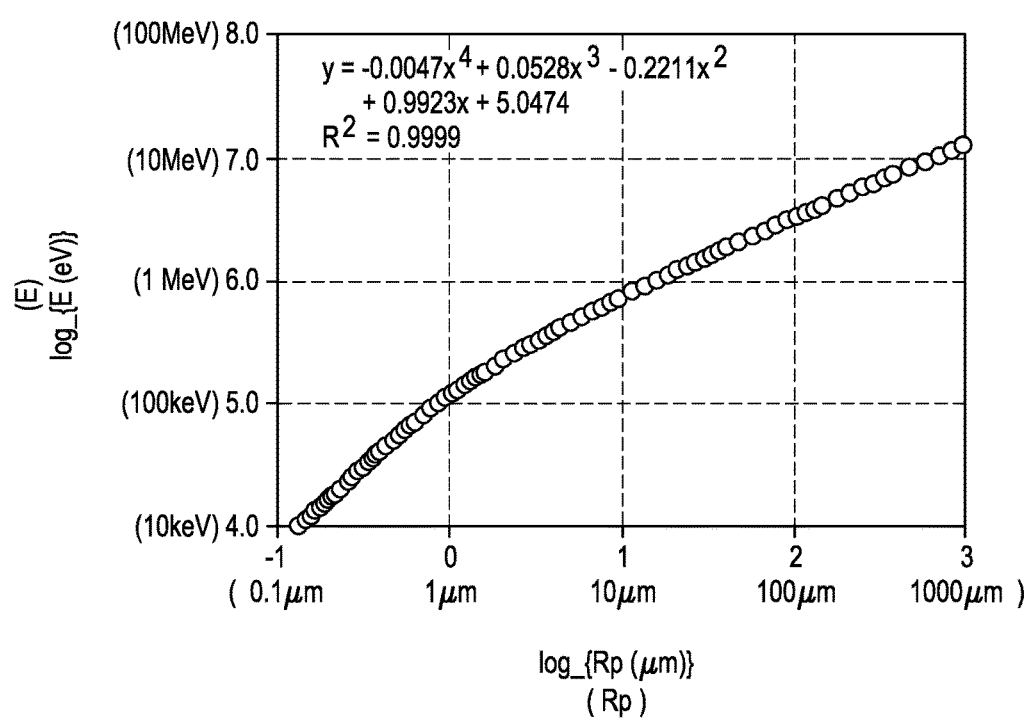
FIG. 9 is a characteristic diagram illustrating the relationship between the projected range of protons and the acceleration energy of the protons in the semiconductor device according to the invention.

The acceleration energy of protons in a method for producing a semiconductor device according to Embodiment 5 of the invention will be described. The acceleration energy of the protons may be determined from the characteristic graph shown in FIG. 9 in order to form an FS layer which a depletion layer reaches first and which has a peak position that is at a distance X from the rear surface, using proton irradiation, such that the above-mentioned range of γ is satisfied in practice. FIG. 9 is a characteristic diagram illustrating the relationship between the projected range of the protons and the acceleration energy of the protons in the semiconductor device according to the invention.

The results of the inventors' research proved that, for the projected range Rp (the peak position of the FS layer) of the protons and the acceleration energy E of the protons, when the logarithm log(Rp) of the projected range Rp of the protons was x and the logarithm log(E) of the acceleration energy E of the protons was y, x and y satisfied the following relationship represented by Expression (2).

$$y=-0.0047x^4+0.0528x^3-0.2211x^2+0.9923x+5.0474 \quad \text{Expression (2)}$$

FIG. 9 is a characteristic graph indicating the above-mentioned Expression (2). FIG. 9 shows the acceleration energy of the protons for obtaining the desired projected range of the protons. In FIG. 9, the horizontal axis is the logarithm log(Rp) of the projected range Rp of the protons and indicates the projected range Rp (μm) corresponding to the parentheses below the axis value of log(Rp). In addition, the vertical axis is the logarithm log(E) of the acceleration energy E of the protons and indicates the acceleration energy E of the protons corresponding to the parentheses on the left side of the axis value of log(E). The above-mentioned Expression (2) is obtained by fitting the value of the logarithm log(Rp) of the projected range Rp of the protons and the value of the logarithm log(E) of the acceleration energy, which are obtained by, for example, experiments, with a four-order polynomial of x (=log(Rp)).

The following relationship may be considered between the actual acceleration energy E' and an average projected range Rp' (proton peak position) which is actually obtained by, for example, the spreading resistance (SR) method when the above-mentioned fitting equation is used to calculate the acceleration energy E of proton irradiation from the desired average projected range Rp of the protons and the protons are implanted into a silicon substrate with the calculated value of the acceleration energy.

When the actual acceleration energy E' is in the range of about ±10% of the calculated value E of the acceleration energy, the actual average projected range Rp' is within the range of about ±10% of the desired average projected range Rp and is in a measurement error range. Therefore, the influence of a variation in the actual average projected range Rp' from the desired average projected range Rp on the electrical characteristics of an IGBT is so small to be negligible. When the actual acceleration energy E' is in the range of ±10% of the calculated value E, it is possible to determine that the actual average projected range Rp' is substantially equal to the set average projected range Rp. Alternatively, when the actual average projected range Rp' is in the range of about ±10% of the average projected range Rp obtained by applying the actual acceleration energy E' to the above-mentioned Expression (2), no problem occurs.

In the actual accelerator, since the acceleration energy E and the average projected range Rp are both in the above-mentioned ranges (±10%), it is considered that the actual acceleration energy E' and the actual average projected range Rp' follow the above-mentioned fitting equation represented by the desired average projected range Rp and the calculated value E and no problem occurs. In addition, a variation or error range may be equal to or less than ±10% of the average projected range Rp. When the variation or error range is within the range of ±5%, it can be considered that the actual acceleration energy E' and the actual average projected range Rp' follow the above-mentioned Expression (2).

The above-mentioned Expression (2) is used to calculate the acceleration energy E of the protons required to obtain the desired projected range Rp of the protons. The acceleration energy E of each proton for forming the FS layer is also calculated by the above-mentioned Expression (2) and is well matched with the value of a sample measured by the known spreading resistance measurement method (SR method) after proton irradiation is performed with the above-mentioned acceleration energy E'. Therefore, when the above-mentioned Expression (2) is used, it is possible to predict the required acceleration energy E of protons with high accuracy, on the basis of the projected range Rp of the protons.

Embodiment 6

A semiconductor device according to Embodiment 6 will be described. The process flow shown in FIG. 1 is an example of the process flow for producing the IGBT 100 and can be applied to a diode. In this case, the process (a) of FIG. 1 is a process for forming an anode layer. In the process (e) of FIG. 1, boron is replaced with phosphorus or arsenic and a cathode layer is formed by the process (f) of FIG. 1. The cross-sectional view of the diode which is formed in this way is shown in FIG. 13. FIG. 13 is a cross-sectional view illustrating the diode according to the invention. A p anode layer 52 is formed in the front surface of a semiconductor substrate which will be an n drift layer 1 and an n cathode layer 53 is formed in the rear surface. Reference numeral 51 denotes an anode electrode and reference numeral 54 denotes a cathode electrode. For example, the position or concentration of a field stop layer 3, an n-type disorder reduction region 18, and a n-type intermediate layer 27 which is a combination of the field stop layer 3 and the n-type disorder reduction region 18 is appropriately adjusted, similarly to the IGBT. In Embodiment 6, in the diode, the preferred position of the first proton peak position among a plurality of proton irradiation operations is the same as that in the IGBT when the turn-off oscillation is replaced with reverse recovery oscillation and the oscillation start threshold value $V_{RRO}$ is the threshold voltage of the power supply voltage $V_{cc}$ at which the voltage waveform of the diode starts to oscillate.

In each of the above-described embodiments, various modifications and changes can be made without departing from the scope and spirit of the invention. In the above-described embodiments, the hydrogen ions implanted into the semiconductor substrate described as protons. However, for example, double hydrogen ions and triple hydrogen ions may be implanted. The range of the double hydrogen ions and the triple hydrogen ions is shorter than that of protons since the mass thereof is increased due to a neutron. Therefore, it is preferable to use protons in order to form the n-type intermediate layer 27 at a deep position from the surface of the semiconductor substrate.

As described above, the semiconductor device and the method for producing the semiconductor device according to the invention are useful as power semiconductor devices used for power conversion apparatuses such as converters or inverters.

Thus, a semiconductor device and a method for producing the same have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

REFERENCE SIGNS LIST

1 n DRIFT LAYER
2 n EMITTER LAYER
3 n-TYPE FIELD STOP LAYER
3*a* END
4 p COLLECTOR LAYER
11 n SEMICONDUCTOR SUBSTRATE
11*a* FRONT SURFACE
11*b* REAR SURFACE
12 CARRIER CONCENTRATION PROFILE WHEN LASER ANNEALING PROCESS IS PERFORMED
13 CARRIER CONCENTRATION PROFILE WHEN LASER ANNEALING PROCESS IS NOT PERFORMED
14 PROTON PASSAGE REGION
15 DISORDER REGION
16 PROTON IMPLANTATION
17 PROJECTED RANGE
18 n-TYPE DISORDER REDUCTION REGION
22 p BASE LAYER
23 GATE INSULATING FILM
24 GATE ELECTRODE
25 EMITTER ELECTRODE
27 n-TYPE INTERMEDIATE LAYER
28 INTERLAYER INSULATING FILM
33 COLLECTOR ELECTRODE
100 IGBT

What is claimed is:

1. A method for producing a semiconductor device comprising:
   performing proton implantation from one main surface of a semiconductor substrate;
   heating the entire semiconductor substrate at a high temperature to form a hydrogen-induced donor using the proton implantation, thereby forming an n-type field stop layer in the semiconductor substrate with a higher concentration than the semiconductor substrate, the n-type field stop layer being positioned at a range of at least 15 µm from the one main surface of the semiconductor substrate;
   heating a portion of the semiconductor substrate corresponding to the range of the implanted protons from the one main surface to reduce a disorder generated in a proton passage region, thereby forming an n-type disorder reduction region with a lower concentration than the n-type field stop layer; and
   forming a p-type collector layer on the one main surface side of the semiconductor substrate, wherein the n-type disorder reduction region is disposed between the p-type collector layer and the n-type field stop layer.

2. The method for producing a semiconductor device according to claim 1, wherein, in the forming the field stop layer, a process of heating the entire semiconductor substrate at a high temperature is a furnace annealing process, and in the forming the disorder reduction region, a process of heating the portion of the semiconductor substrate corresponding to the range of the implanted protons from the one main surface is a laser annealing process of radiating laser light to the one main surface.

3. The method for producing a semiconductor device according to claim 2, wherein the disorder is reduced from the one main surface to a depth of 5 µm or more by the laser annealing process.

4. The method for producing a semiconductor device according to claim 2, wherein carrier mobility in the proton passage region is increased by the furnace annealing process and the laser annealing process.

5. The method for producing a semiconductor device according to claim 2, wherein the temperature of the furnace annealing process is equal to or higher than 350° C. and equal to or lower than 550° C., and the processing time of the furnace annealing process is equal to or more than 1 hour and equal to or less than 10 hours.

6. The method for producing a semiconductor device according to claim 2, wherein a YAG laser or a semiconductor laser is used in the laser annealing process.

7. The method for producing a semiconductor device according to claim 2, further comprising a implanting impurity ions into a surface layer of the one main surface which is shallower than the range of the implanted protons and activating the impurity using the laser annealing process after the proton implantation and before the laser annealing process.

8. The method for producing a semiconductor device according to claim 1, wherein the range of the implanted protons is equal to or more than 15 µm.

9. The method for producing a semiconductor device according to claim 1, wherein the disorder causes carrier mobility in the proton passage region to be lower than that in a region other than the proton passage region in the semiconductor substrate.

10. The method for producing a semiconductor device according to claim 1, wherein the forming the field stop layer and the forming the disorder reduction region are performed after a rear surface of the semiconductor substrate is ground and before a rear electrode is formed.

11. The method for producing a semiconductor device according to claim 1, wherein the forming the field stop layer is performed after the performing the proton implantation and before the forming the disorder reduction region.

12. The method for producing a semiconductor device according to claim 1, wherein the forming the disorder reduction region is performed after the performing the proton implantation and before the forming the field stop layer.

13. The method for producing a semiconductor device according to claim 1, wherein the proton implantation is performed according to an acceleration energy E of the protons, and, when the logarithm log(Rp) of an average range Rp of the implanted protons is x and the logarithm log(E) of the acceleration energy E of the proton implantation is y, the acceleration energy E of the protons when the field stop layer with the range Rp of the implanted protons is formed satisfies the following Expression (2):

$$y=-0.0047x^4+0.0528x^3-0.2211x^2+0.9923x+5.0474 \quad \text{Expression (2).}$$

14. A semiconductor device that is produced by the method for producing a semiconductor device according to claim 1, wherein the semiconductor device is an IGBT including the field stop layer.

15. A semiconductor device that is produced by the method for producing a semiconductor device according to claim 1, wherein the semiconductor device is an FWD including the field stop layer.

16. The method for producing a semiconductor device according to claim 1, wherein the heating the portion of the semiconductor substrate corresponding to the range of the implanted protons from the one main surface includes a laser annealing process of radiating laser light to the one main surface with a wavelength of the last light being in a range of 10 μm to 1,000 μm.

17. The method for producing a semiconductor device according to claim 1, wherein a minimum value of carrier mobility in the disorder reduction region is equal to or more than 20% of the carrier mobility in a crystal state.

* * * * *